United States Patent
Johnson et al.

(10) Patent No.: US 6,187,372 B1
(45) Date of Patent: Feb. 13, 2001

(54) METHOD FOR PRODUCING LARGE AREA THICK FILM RESISTORS WITH UNIFORM THICKNESS

(75) Inventors: Rosemary O Johnson; John F Casey, both of Colorado Springs; Lewis R Dove, Monument, all of CO (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/301,898

(22) Filed: Apr. 29, 1999

(51) Int. Cl.[7] .............................. B05D 5/12; B05C 17/06
(52) U.S. Cl. ..................... 427/102; 427/103; 427/282; 101/127.1; 101/128.1; 101/129
(58) Field of Search .................................. 427/102, 103, 427/282; 101/127.1, 128.1, 129

(56) References Cited

U.S. PATENT DOCUMENTS

| 4,242,401 | * | 12/1980 | Mitani et al. | 427/282 |
| 4,958,560 | * | 9/1990 | Collins | 427/282 |

* cited by examiner

Primary Examiner—Brian K. Talbot
(74) Attorney, Agent, or Firm—Patrick J. Murphy

(57) ABSTRACT

A method for creating large area, thick film resistors with improved predictability and uniformity. "Tent poles" are employed during the printing of the large area resistors to prop up the screen mesh to ensure the resultant resistor does not have a scooped out center portion. The tent poles can be made from gold pads, resistor spots or emulsion spots.

4 Claims, 3 Drawing Sheets

METHOD FOR PRODUCING LARGE AREA THICK FILM RESISTORS WITH UNIFORM THICKNESS

FIELD OF THE INVENTION

The present invention relates generally to microcircuits and more particularly to large area thick film resistors.

BACKGROUND OF THE INVENTION

Today's complex integrated circuits typically employ many instances of resistors on a single substrate. These resistors come in varying sizes. Hybrid circuitry generally uses thick film resistors with geometries greater than 30 mils. Other applications of hybrid circuitry and other circuitry may use smaller resistors which provide for a more cost-effective circuit since less area on the ceramic is used.

Techniques, such as the one described in "Power Considerations in Small Geometry Thick Film Resistors," Andy London et al., Heraeus Technical Paper, 1999, which is incorporated herein by reference for all that it teaches, have been developed to improve upon small thick film resistors. However, absent in the art is a technique to improve upon the printing of thick film resistors. One problem which is encountered while printing thick film resistors is commonly referred to as "screen sag" in which the center portion of the resistor is scooped out by the squeegee.

SUMMARY OF THE INVENTION

The present invention provides large area, thick film resistors with improved predictability and uniformity and method for producing same. "Tent poles" are employed during the printing of the large area resistors to prop up the screen mesh to ensure the resultant resistor does not have a scooped out center portion.

DETAILED DESCRIPTION OF THE PREFERRED EMBODIMENT

Figure 1A:
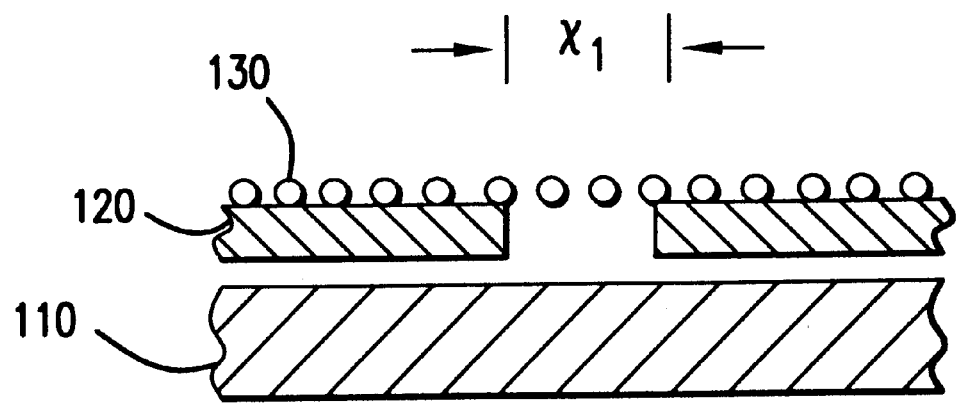
FIGS. 1*a*, 1*b* and 1*c* show a progression of side views of printing a small resistor.

FIG. 1*a* shows a side view of a representative first step in printing a small resistor. An emulsion 120 is disposed upon a substrate 110. The substrate 110 can be, for example, 96% alumina. Screen wire 130 is disposed upon the emulsion paste 120. In a preferred embodiment, the distance between the emulsion 120 print is $x_1$, where $x_1$ is less than 40 mils wide.

Figure 1B:
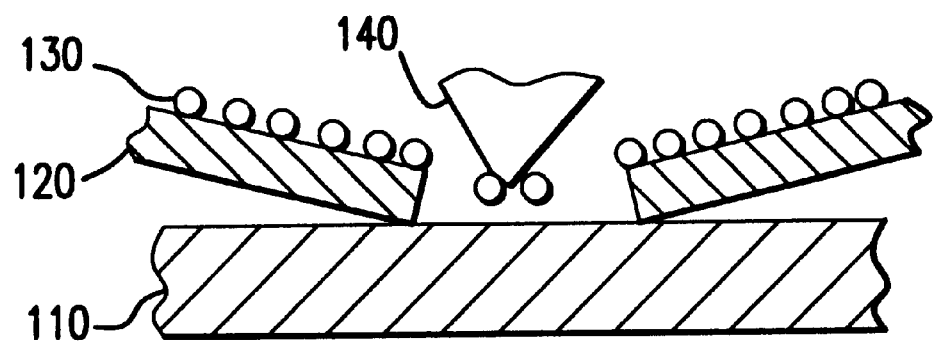
Figure 1C:
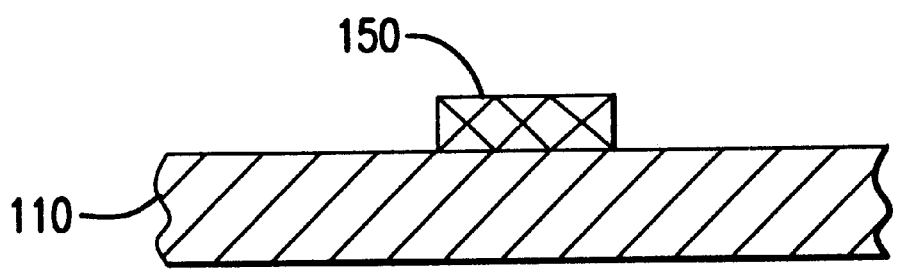

In FIG. 1*b*, a squeegee 140 is moved across the screen 130 and emulsion 120, leaving the resistor 150 (in FIG. 1*c*). As illustrated, the thickness of the small resistor 150 is determined by the thickness of the mesh 130 and emulsion 120.

Figure 2A:
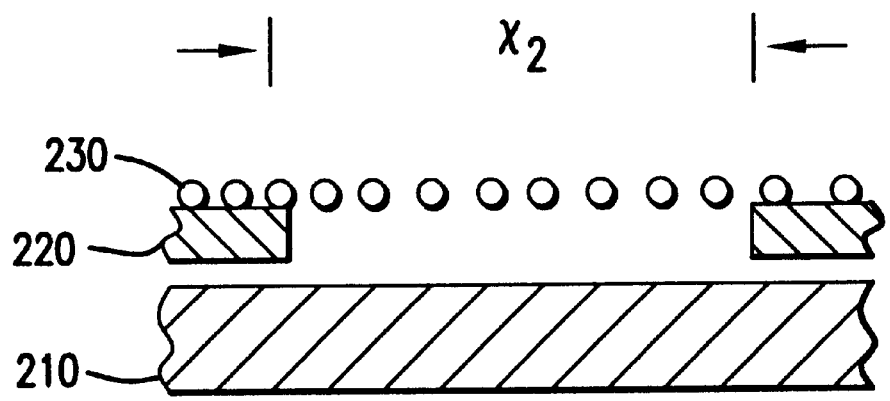
FIGS. 2*a*, 2*b* and 2*c* show a progression of side views of printing a large resistor.
Figure 2B:
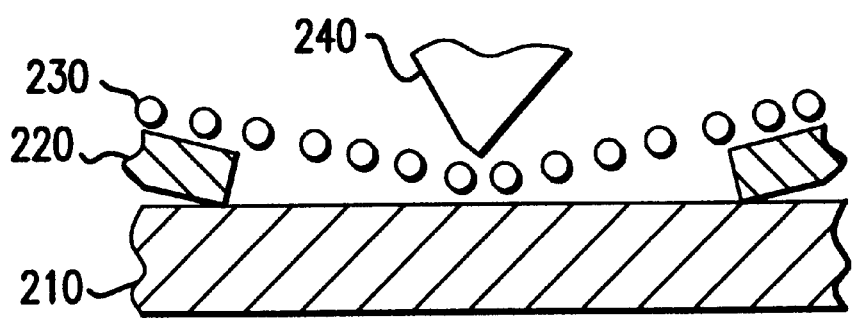
Figure 2C:
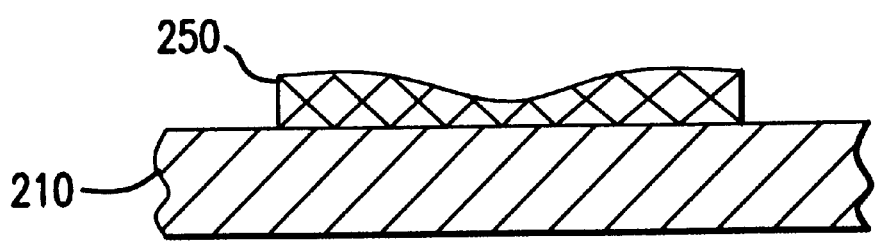

Referring now to FIGS. 2*a* through 2*c* wherein a similar progression of side views is illustrated. In FIG. 2, the resistor to be printed in relatively large compared to the resistor printed in FIG. 1. In a preferred embodiment, the distance $x_2$ is greater than 40 mils wide.

Since there is a large span between emulsion prints 220, the only thing supporting the squeegee 240 as it is passed across the material is the mesh 230. The resistor 250 that results has a scooped-out middle section. This is commonly referred to as "screen sag" That is, the thickness at the edges of the large resistor 250 is determined by the thickness of the emulsion 220 and the mesh 230, the thickness of the center portion of the large resistor 250 is determined by the mesh thickness only.

So, in general, the large resistor 250 will print thin, resulting in a higher sheet resistance than a comparable aspect-ratio small resistor (see FIG. 1). And, since the large resistor 250 tends to print too thin, the resultant resistor value may be larger than was required. A laser trim cannot solve this overshoot problem since common laser trimming techniques only trim resistance up (i.e., resistance increases).

A novel technique that can be used to solve this screen sag problem is presented herewith. Basically, the screen is "propped up" during the resistor print process. A "tent pole" is used to raised the center portion of the mesh; the trick is to use a simple tent pole, without adversely effecting the resistor. Refer now to FIG. 3 wherein three different methods are presented.

Figure 3A:
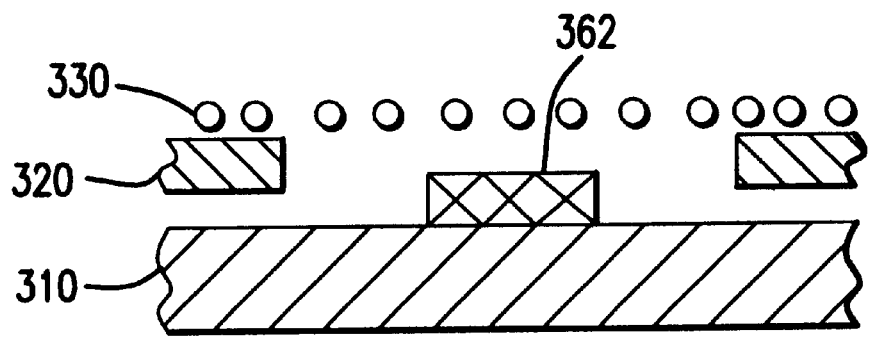
FIGS. 3*a*, 3*b* and 3*c* show three embodiments of the present invention in which "tent poles" are used to prop up resistive screen wire prior to printing.

In FIG. 3*a*, a tent pole made of gold 362 is used. The technique is to print small gold pads in the interior of the resistor (i.e., between the emulsion 320 prints). The gold pads can be printed at the same time as printing the conductors. The advantage of this technique is that it is easy and there are no extra prints.

Figure 3B:
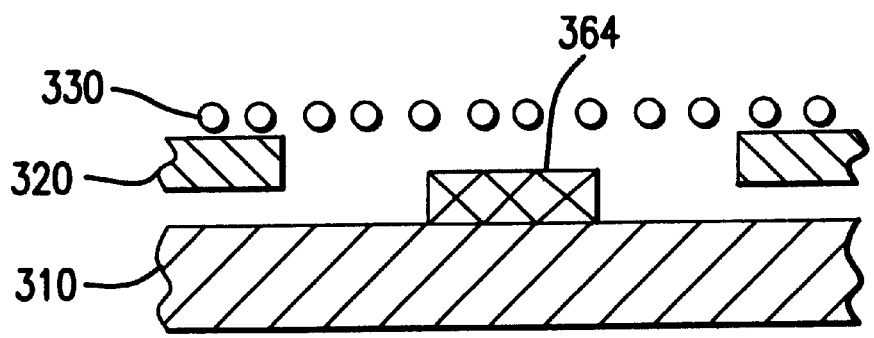

In FIG. 3*b*, a tent pole made of resistor 364 is used. The technique is to print a small resistor spot in the interior of the resistor (i.e., between the emulsion 320 prints). The resistor spot must be printed prior to printing the large resistor. The spot 364 should be small, for example, less than 10×10 mils. The advantage of this technique is that it uses a uniform material and it's extendable (i.e., can print several dry resistor spots on the same area to add height to the tent pole).

Figure 3C:
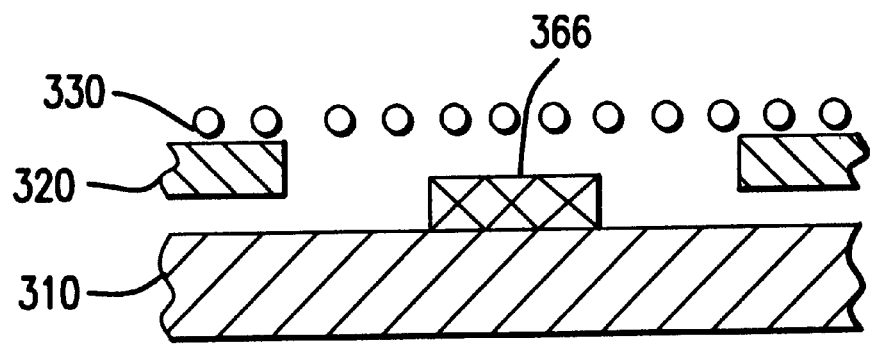

In FIG. 3*c*, a tent pole made of emulsion 366 is used. The technique is to print a small emulsion spot in the interior of the resistor (i.e., between the emulsion 320 prints). The emulsion spot can be printed at the same time the other emulsion print is printed. The spot 364 should be small, for example, less than 10×10 mils. The advantage of this technique is that it is self-leveling (i.e., spots are exactly the same thickness as the emulsion at the end of the resistor).

What is claimed is:

1. A method for printing a large area resistor comprising the steps of:

(1) printing an emulsion on a substrate, the emulsion print having a void of predetermined width;

(2) placing a tent pole in the void;

(3) laying down a screen mesh above the emulsion and tent pole; and (4) using a squeegee to produce the large area resistor having a uniform thickness while retaining said tent pole in said large area resistor.

2. The method of claim 1 wherein the tent pole is a gold pad.

3. The method of claim 1 wherein the tent pole is a resistor spot.

4. The method of claim 1 wherein the tent pole is an emulsion spot.

* * * * *